US008895372B2

(12) United States Patent
Guo et al.

(10) Patent No.: US 8,895,372 B2
(45) Date of Patent: Nov. 25, 2014

(54) GRAPHENE BASED THREE-DIMENSIONAL INTEGRATED CIRCUIT DEVICE

(75) Inventors: Dechao Guo, Wappingers Falls, NY (US); Shu-Jen Hen, Wappingers Falls, NY (US); Chung-Hsun Lin, White Plains, NY (US); Ning Su, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/557,501

(22) Filed: Jul. 25, 2012

(65) Prior Publication Data

US 2012/0295423 A1 Nov. 22, 2012

Related U.S. Application Data

(62) Division of application No. 12/719,058, filed on Mar. 8, 2010, now Pat. No. 8,450,779.

(51) Int. Cl.
*H01L 21/84* (2006.01)
*H01L 27/06* (2006.01)
*H01L 29/16* (2006.01)

(52) U.S. Cl.
CPC ......... *H01L 27/0688* (2013.01); *H01L 29/1606* (2013.01); *Y10S 977/755* (2013.01)
USPC .......................................... 438/149; 977/755

(58) Field of Classification Search
CPC ....................... H01L 29/1606; H01L 29/66045
USPC ............................. 977/755; 438/149, 154, 479
See application file for complete search history.

(56) References Cited

U.S. PATENT DOCUMENTS

| 6,271,542 | B1 * | 8/2001 | Emma et al. ................. 257/903 |
| 7,297,977 | B2 * | 11/2007 | Hoffman et al. ............... 257/43 |
| 7,312,487 | B2 | 12/2007 | Alam et al. |
| 7,482,232 | B2 | 1/2009 | Appenzeller et al. |
| 7,619,257 | B2 | 11/2009 | Pfeiffer |
| 7,952,088 | B2 | 5/2011 | Anderson et al. |
| 8,043,978 | B2 | 10/2011 | Miyazaki et al. |

(Continued)

FOREIGN PATENT DOCUMENTS

| CN | 101346808 A | 1/2009 |
| JP | 2007335532 A | 12/2007 |

OTHER PUBLICATIONS

J.D. Caldwell et al.; "Technique for the Dry Transfer of Epitaxial Graphene onto Arbitrary Substrates;" ACS NANO vol. 4., No. 2; Jan. 25, 2010; pp. 1108-1114.

(Continued)

*Primary Examiner* — Stephen W Smoot
*Assistant Examiner* — Sun M Kim
(74) *Attorney, Agent, or Firm* — Cantor Colburn LLP; Vazken Alexanian

(57) ABSTRACT

A three-dimensional (3D) integrated circuit (IC) structure includes a first layer of graphene formed over a substrate; a first level of one or more active devices formed using the first layer of graphene; an insulating layer formed over the first level of one or more active devices; a second layer of graphene formed over the insulating layer; and a second level of one or more active devices formed using the second layer of graphene, the second level of one or more active devices electrically interconnected with the first level of one or more active devices.

4 Claims, 7 Drawing Sheets

(56) References Cited

U.S. PATENT DOCUMENTS

| | | |
|---|---|---|
| 8,124,463 B2 * | 2/2012 | Chen et al. .................. 438/151 |
| 8,247,806 B2 | 8/2012 | Chae et al. |
| 2007/0084630 A1 | 4/2007 | Cho |
| 2007/0284734 A1 | 12/2007 | Kamins et al. |
| 2008/0231361 A1 | 9/2008 | Ludwig |
| 2008/0290941 A1 | 11/2008 | Ludwig |
| 2009/0020764 A1 | 1/2009 | Anderson et al. |
| 2009/0029221 A1 | 1/2009 | Goddard et al. |
| 2009/0140801 A1 | 6/2009 | Ozyilmaz et al. |
| 2009/0174435 A1 | 7/2009 | Stan et al. |
| 2009/0181502 A1 | 7/2009 | Parikh et al. |
| 2009/0200707 A1 | 8/2009 | Kivioja et al. |
| 2009/0225592 A1 | 9/2009 | Lau et al. |
| 2009/0283735 A1 | 11/2009 | Li et al. |
| 2010/0006823 A1 * | 1/2010 | Anderson et al. ................ 257/24 |
| 2010/0051960 A1 | 3/2010 | Chen et al. |
| 2010/0258787 A1 | 10/2010 | Chae et al. |
| 2011/0059599 A1 | 3/2011 | Ward et al. |

OTHER PUBLICATIONS

Li et al.; "Carbon Nanomaterials for Next-Generation Interconnects and Passives: Physics, Status, and Prospects;" IEEE Transactions of Electron Devices, vol. 56, No. 9, Sep. 2009; pp. 1799-1821.

International Search Report; International Application No. PCT/US2011/023665; International Filing Date: Feb. 4, 2011; Date of Mailing: Mar. 30, 2011; pp. 1-5.

International Search Report—Written Opinion; International Application No. PCT/US2011/023665; International Filing Date: Feb. 4, 2011; Date of Mailing: Mar. 30, 2011; pp. 1-5.

* cited by examiner

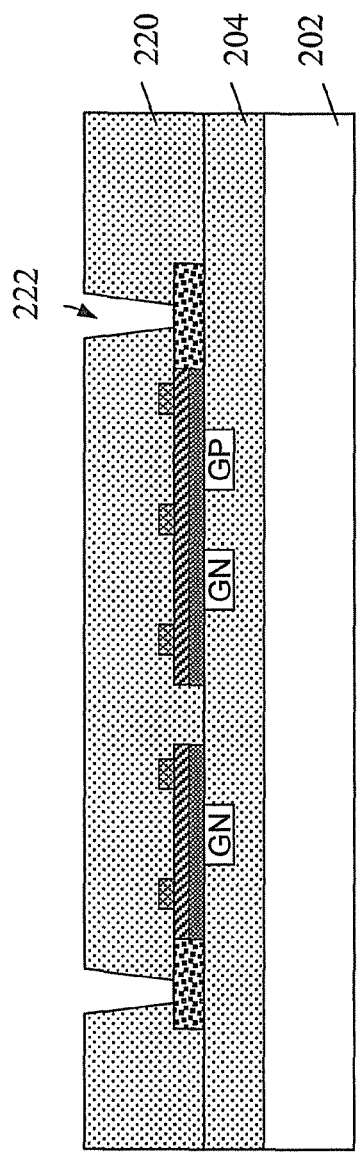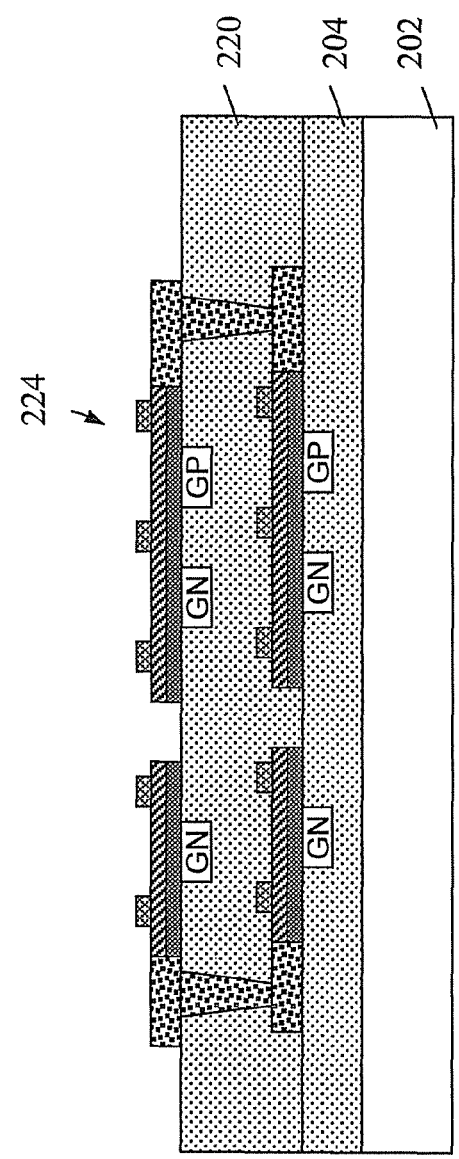
Figure 2(j)
Figure 2(k)

GRAPHENE BASED THREE-DIMENSIONAL INTEGRATED CIRCUIT DEVICE

CROSS-REFERENCE TO RELATED APPLICATION

This application is a divisional of U.S. patent application Ser. No. 12/719,058, filed Mar. 8, 2010, now U.S. Pat. 8,450,779, the disclosure of which is incorporated by reference herein in its entirety.

BACKGROUND

The present invention relates generally to semiconductor device manufacturing and, more particularly, to a graphene based, three-dimensional (3D) integrated circuit device.

Graphene refers to a two-dimensional planar sheet of carbon atoms arranged in a hexagonal benzene-ring structure. A free-standing graphene structure is theoretically stable only in a two-dimensional space, which implies that a truly planar graphene structure does not exist in a three-dimensional space, being unstable with respect to formation of curved structures such as soot, fullerenes, nanotubes or buckled two dimensional structures. However, a two-dimensional graphene structure may be stable when supported on a substrate, for example, on the surface of a silicon carbide (SiC) crystal. Free standing graphene films have also been produced, but they may not have the idealized flat geometry.

Structurally, graphene has hybrid orbitals formed by $sp^2$ hybridization. In the $sp^2$ hybridization, the 2s orbital and two of the three 2p orbitals mix to form three $sp^2$ orbitals. The one remaining p-orbital forms a pi ($\pi$)-bond between the carbon atoms. Similar to the structure of benzene, the structure of graphene has a conjugated ring of the p-orbitals, i.e., the graphene structure is aromatic. Unlike other allotropes of carbon such as diamond, amorphous carbon, carbon nano-foam, or fullerenes, graphene is only one atomic layer thin.

Graphene has an unusual band structure in which conical electron and hole pockets meet only at the K-points of the Brillouin zone in momentum space. The energy of the charge carriers, i.e., electrons or holes, has a linear dependence on the momentum of the carriers. As a consequence, the carriers behave as relativistic Dirac-Fermions with a zero effective mass and are governed by Dirac's equation. Graphene sheets may have a large carrier mobility of greater than 200,000 $cm^2$/V-sec at 4K. Even at 300K, the carrier mobility can be as high as 15,000 $cm^2$/V-sec.

Graphene layers may be grown by solid-state graphitization, i.e., by sublimating silicon atoms from a surface of a silicon carbide crystal, such as the (0001) surface. At about 1,150° C., a complex pattern of surface reconstruction begins to appear at an initial stage of graphitization. Typically, a higher temperature is needed to form a graphene layer. Graphene layers on another material are also known in the art. For example, single or several layers of graphene may be formed on a metal surface, such as copper and nickel, by chemical deposition of carbon atoms from a carbon-rich precursor.

Graphene displays many other advantageous electrical properties such as electronic coherence at near room temperature and quantum interference effects. Ballistic transport properties in small scale structures are also expected in graphene layers.

Despite the fact that the graphene was isolated for the first time only a few years ago (by using ordinary Scotch tape), this field currently being intensively studied. Because of the unique electrical properties such as those described above (e.g., high charge carrier mobility etc.), graphene is ultimately promising for electronic applications. For example, graphene transistors have been demonstrated recently, and more advanced graphene circuits are considered to be promising candidates to perhaps replace silicon in future integrated circuit technology. However, the lack of easy and low cost graphene fabrication processes presently limits the development of graphene applications.

SUMMARY

In an exemplary embodiment, a three-dimensional (3D) integrated circuit (IC) structure includes a first layer of graphene formed over a substrate; a first level of one or more active devices formed using the first layer of graphene; an insulating layer formed over the first level of one or more active devices; a second layer of graphene formed over the insulating layer; and a second level of one or more active devices formed using the second layer of graphene, the second level of one or more active devices electrically interconnected with the first level of one or more active devices.

In another embodiment, a method of forming a three-dimensional (3D) integrated circuit (IC) structure includes forming a first layer of graphene over a substrate; forming a first level of one or more active devices using the first layer of graphene; forming an insulating layer over the first level of one or more active devices; forming a second layer of graphene over the insulating layer; and forming a second level of one or more active devices using the second layer of graphene, the second level of one or more active devices electrically interconnected with the first level of one or more active devices.

BRIEF DESCRIPTION OF THE SEVERAL VIEWS OF THE DRAWINGS

Referring to the exemplary drawings wherein like elements are numbered alike in the several Figures:

FIGS. 2(a) through 2(k) are a series of cross-sectional views illustrating an exemplary method of forming a graphene based, 3D integrated circuit, in accordance with an alternative embodiment of the invention.

DETAILED DESCRIPTION

Disclosed herein are embodiments of a graphene based, three-dimensional (3D) integrated circuit device, and methods of forming the same. In the semiconductor industry, a 3D integrated circuit (IC) generally refers to a chip having two or more layers of active electronic components, integrated both vertically and horizontally into a single circuit. 3D ICs potentially offer many significant benefits, such as for example: a smaller footprint (more functionality fitting into a small space), speed (the average wire length becomes much shorter, in turn reducing signal propagation delay and increasing overall performance), power consumption (by keeping a signal on-chip, the resulting shorter wires reduce power consumption and produce less parasitic capacitance), and heterogeneous integration, to name a few. In the case of heterogeneous integration, different circuit layers may be formed with different processes, or even on different types of wafers. Moreover, components otherwise having completely incompatible manufacturing processes could be combined in a single device.

Currently, 3D ICs may be formed by techniques such as wafer-on-wafer bonding, wherein electronic components are built on two or more semiconductor wafers, which are then aligned, bonded, and diced into 3D ICs. Each wafer may be thinned before or after bonding. Vertical connections are either built into the wafers before bonding or otherwise created in the stack after bonding. These "through-silicon vias" (TSVs) pass through the silicon substrate(s) between active layers and/or between an active layer and an external bond pad. In a die-on-wafer process, electronic components are built on two semiconductor wafers. One wafer is diced, and the singulated dies are aligned and bonded onto die sites of the second wafer. As in the wafer-on-wafer method, thinning and TSV creation are performed either before or after bonding. Additional dies may be added to the stacks before dicing. Alternatively, in a die-on-die process, electronic components are built on multiple dies, which are then aligned and bonded. Thinning and TSV creation may be done before or after bonding.

In order to avoid multiple substrates and aligning, thinning, bonding, or TSV techniques, 3D ICs would desirably be formed monolithically. That is, the electronic components and their connections (wiring) are built in layers on a single semiconductor wafer, which is then diced into 3D ICs. Unfortunately, existing applications of this method are currently limited because creating conventional transistors in semiconductor layers (e.g., dopant implantation and activation annealing) requires processing temperatures that are incompatible with existing wiring.

Figure 1A:
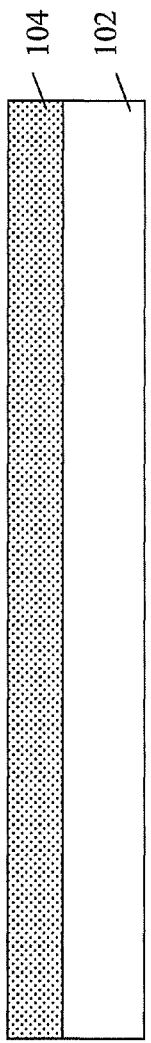
FIGS. 1(a) through 1(h) are a series of cross-sectional views illustrating an exemplary method of forming a graphene based, three-dimensional (3D) integrated circuit, in accordance with an embodiment of the invention.
Figure 1B:
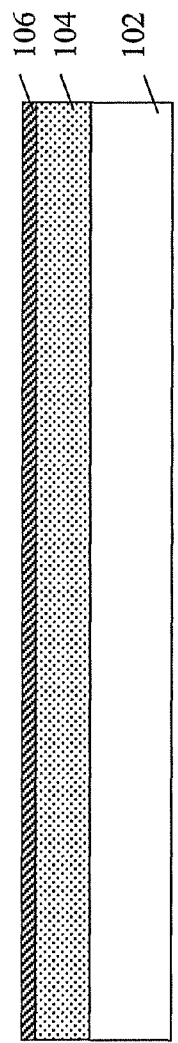

Accordingly, FIGS. 1(a) through 1(h) are a series of cross-sectional views illustrating an exemplary method of forming a graphene based, three-dimensional (3D) integrated circuit. Beginning in FIG. 1(a), a starting substrate 102 (e.g., silicon) has an insulating layer (e.g., an oxide such as $SiO_2$) 104 formed thereon. In FIG. 1(b), a blanket graphene layer 106 is transferred onto the insulating layer 104. The transfer of graphene films may be performed in any suitable manner known in the art such as, for example, by a dry thermal release tape process. In one exemplary embodiment, the graphene layer 106 is a monolayer of graphene. Notably, because graphene is deposited on such a substrate surface in this manner, it is a particularly suitable material for 3D integration.

Figure 1C:
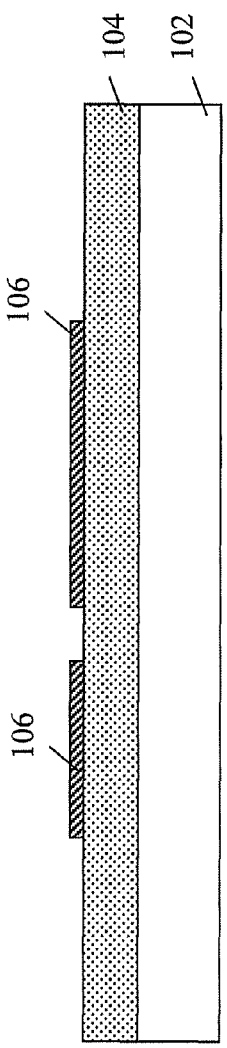
Figure 1D:
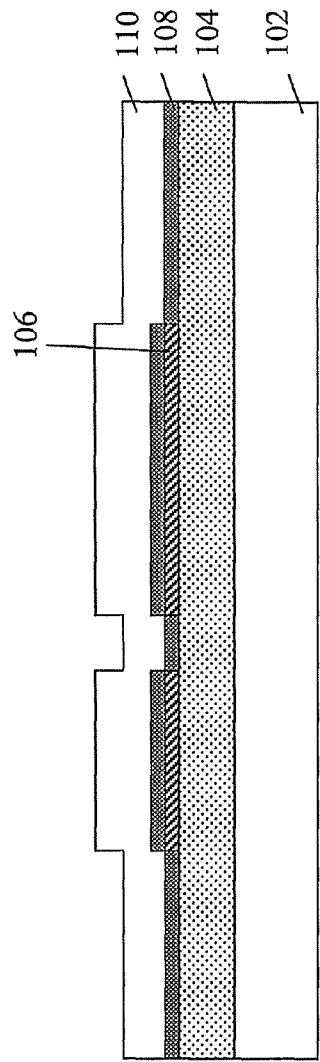

As shown in FIG. 1(c), the graphene layer 106 is patterned through appropriate lithography techniques (e.g., hardmask and/or photoresist layer formation, development and etching) to form desired active areas of graphene-based devices. This is followed by a first level of transistor device formation. As shown in FIG. 1(d), the graphene active areas 106 are covered with transistor gate stack materials such as, for example, a gate dielectric layer 108 and a gate electrode layer 110. In an exemplary embodiment, the gate dielectric layer 108 may be a high-k material such as hafnium, hafnium silicate, zirconium oxide, zirconium silicate, nitrided dielectrics, as well as combinations thereof. The gate electrode layer 110 may include polysilicon, a metal, or combinations thereof.

Figure 1E:
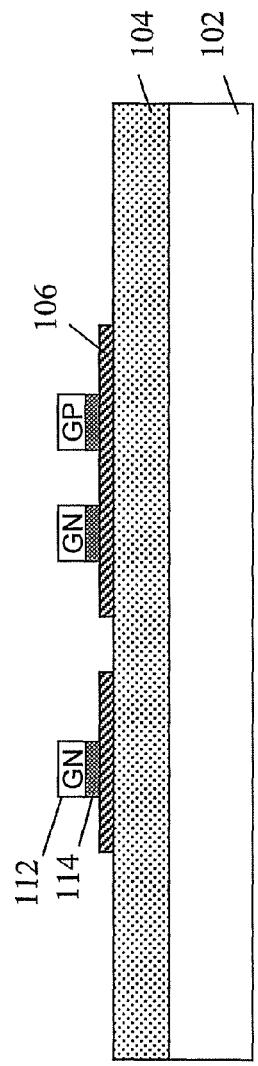

Referring now to FIG. 1(e), the gate dielectric and gate electrode layers 108, 110 are then patterned so as to define transistor devices (e.g., field effect transistors or FETs) on the patterned graphene active areas 106, including gate electrodes 112 and gate dielectric layers 114. It should be noted that the patterning operation depicted in the figures is only illustrative in nature, in that more than one patterning and RIE process may be used, for example, in accordance with different gate stack requirements depending on the type and polarity of the transistor device. Thus, in the exemplary embodiment shown, the designation "GN" refers to a transistor gate for an n-type device (e.g., an NFET) while the designation "GP" refers to a transistor gate for a p-type device (e.g., a PFET).

Figure 1F:
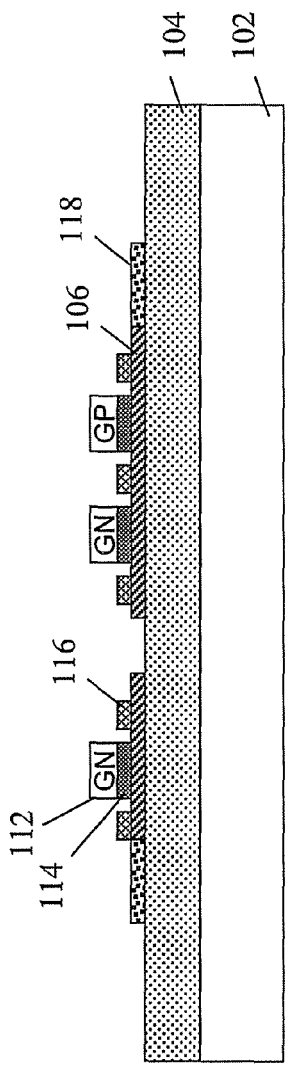

Following gate stack patterning, the formation of source/drain contacts 116 and conductive pad structures 118 is shown in FIG. 1(f). The formation of the source and drain contacts includes, for example deposition of source/drain contact material and patterning. The source/drain contact material may be a metal material such as, for example, titanium (Ti), palladium (Pd), aluminum (Al), tungsten (W), or alloys thereof. The deposition method can be may include, for example, sputtering, and atomic layer deposition (ALD).

Figure 1G:
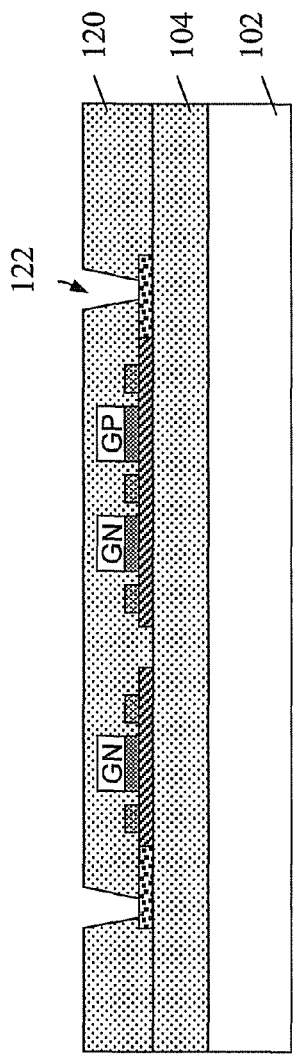
Figure 1H:
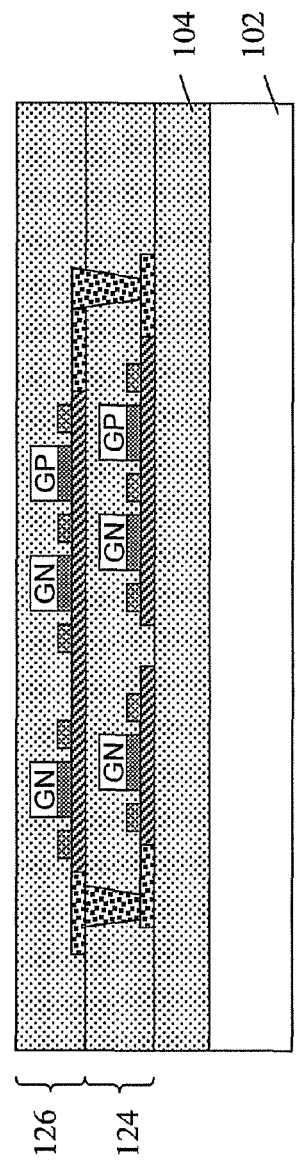

Upon completion of a first layer of graphene circuit devices, an insulating layer 120 (e.g., an oxide) is formed over the devices as shown in FIG. 1(g). Vias 122 are then etched into the insulating layer 120 so as to provide vertical electrical connection to one or more additional levels of graphene based active devices, in accordance with a 3D IC structure. In FIG. 1(h), the lower level 124 of graphene based active devices is shown connected to an upper layer 126 of graphene based active devices. The formation of the upper level 126 is similar to that of the lower level 124, in that a graphene layer (e.g., monolayer) is first deposited/transferred onto the completed lower level 124, followed by patterning of the desired active areas of the graphene, formation and patterning of the gate stack materials, formation and patterning of the source/drain contacts and conductive pads, and formation of an insulating layer over the upper level devices.

Although the illustrative embodiment depicts a pair of graphene based active device levels, it will be appreciated that the above process may be repeated as desired to form still additional graphene based active device levels. In one contemplated embodiment, each level of graphene may have different functions (e.g., logic, analog, memory).

Figure 2A:
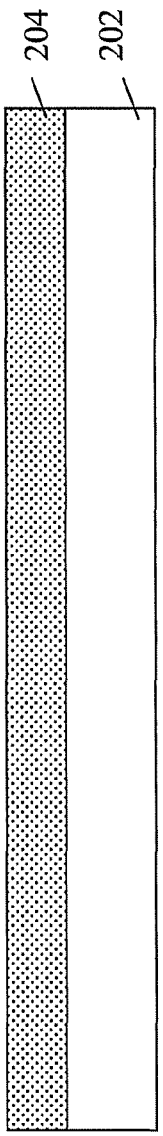

The exemplary 3D IC device embodiment shown in the process flow sequence of FIGS. 1(a) through 1(h) is an example of a top gate orientation, in that the gate electrode and dielectric are disposed above the active graphene source/drain regions. However, the active graphene devices may also be formed using a bottom orientation, as depicted in the process flow sequence of FIGS. 2(a) through 2(k). Beginning in FIG. 2(a), a starting substrate 202 (e.g., silicon) has an insulating layer (e.g., an oxide such as $SiO_2$) 204 formed thereon, similar to the top gate orientation process of FIG. 1(a).

Figure 2B:
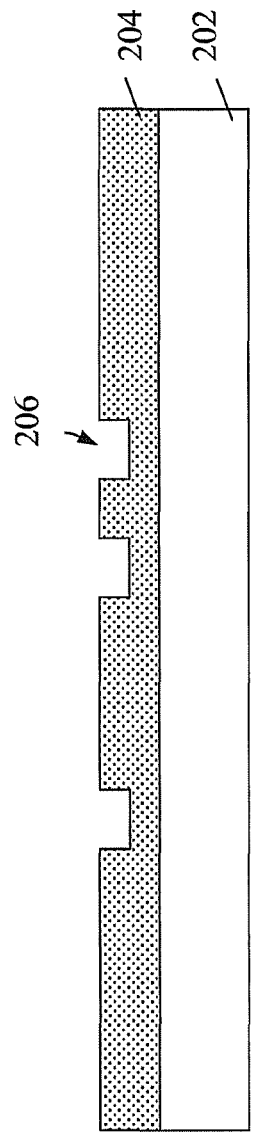
Figure 2C:
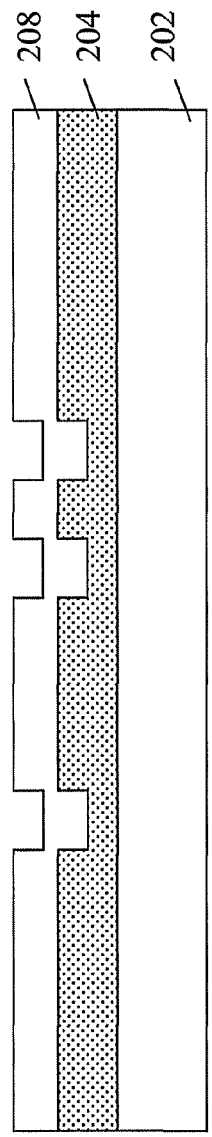
Figure 2D:
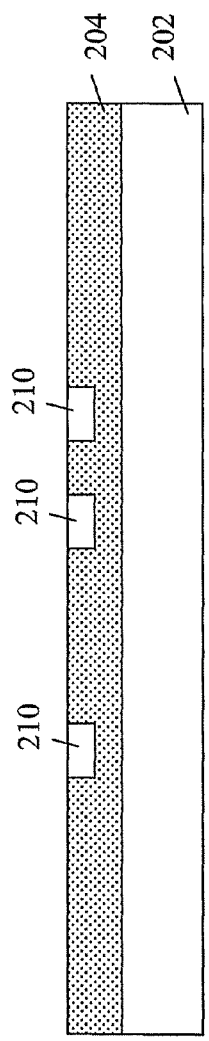
Figure 2E:
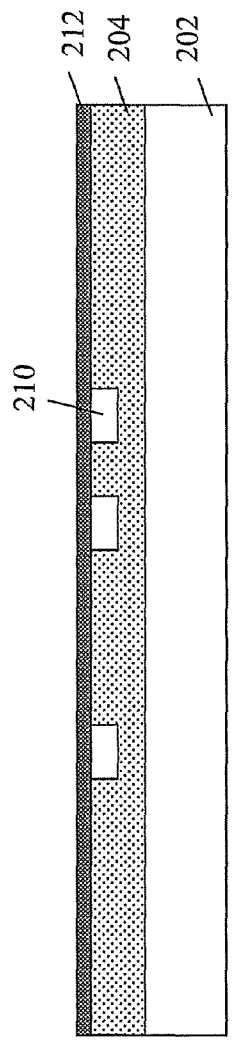

Rather then transferring a graphene layer to the insulating layer 204 at this point in the process, the insulating layer 204 is instead patterned with vias 206 corresponding to the locations of the gates of the lower level graphene based devices, as shown in FIG. 2(b). Then, as shown in FIG. 2(c), a gate electrode layer 208 is formed over the device, filling in the vias. Once the gate electrode layer 208 is planarized, individual gate electrodes 210 are now defined, as shown in FIG. 2(d). A gate dielectric layer 212 is then formed over the insulating layer 204 and gate electrodes 210, as shown in FIG. 2(e). As is the case with the first embodiment, the gate dielectric layer 212 may be a high-k gate dielectric layer.

Figure 2F:
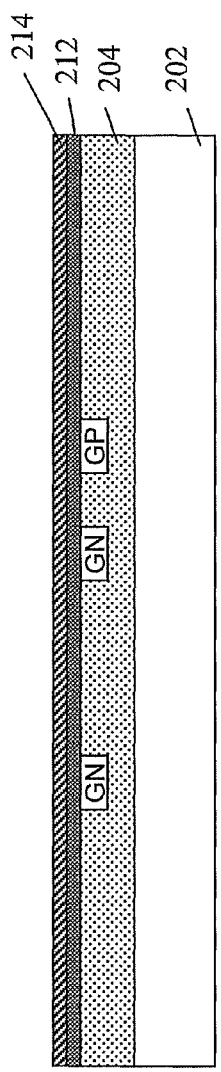

Referring now to FIG. 2(f), a graphene layer 214 is formed on the gate dielectric layer 212. Again, the transfer of graphene films may be performed in any suitable manner known in the art such as, for example, by a dry thermal release tape method. In one exemplary embodiment, the graphene layer 214 is a monolayer of graphene. As also shown in FIG.

2(f), the gate electrodes have been labeled with "GN" and "GP" designations to indicated exemplary n-type and p-type FET devices.

Figure 2G:
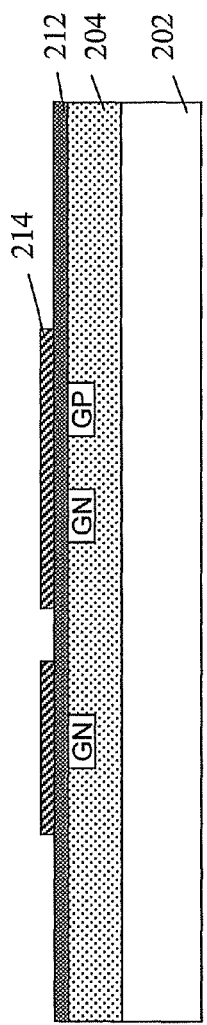
Figure 2H:
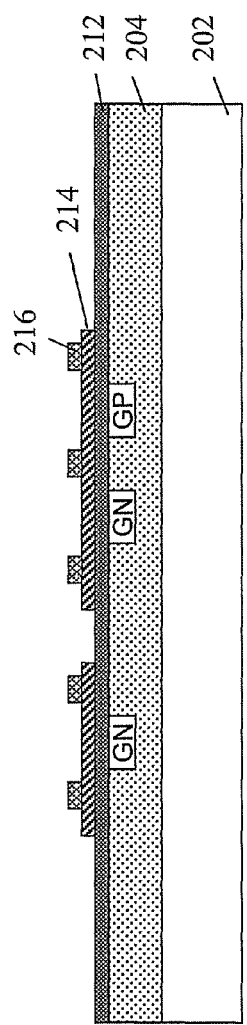
Figure 2I:
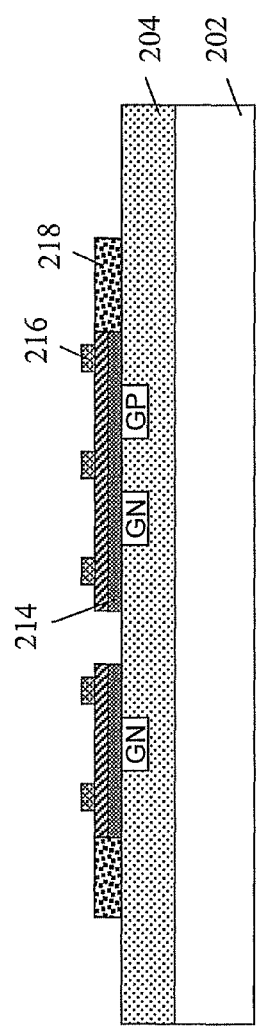

In FIG. 2(g), the graphene layer is patterned in accordance with the desired active areas, and corresponding to the location of the bottom orientation gate electrodes. The blanket gate dielectric layer 212 remains intact at this point. As then shown in FIG. 2(h), source/drain contacts 216 for the graphene based FET devices are formed, followed by gate dielectric layer patterning and formation of conductive pads 218 as illustrated in FIG. 2(i). Thus configured, a first or lower layer of graphene based active devices is completed, and followed by the formation of an insulating layer 220 (e.g., an oxide) over the devices as shown in FIG. 2(j). Vias 222 are then etched into the insulating layer 220 so as to provide vertical electrical connection to one or more additional levels of graphene based active devices, in accordance with a 3D IC structure. Finally, in FIG. 2(k), a second level 224 of graphene based active devices is shown connected to the first level of graphene based active devices. Here, the FET devices of the second level 224 are also bottom orientation gates. However, it is still further contemplated that a graphene based 3D IC structure could have both top orientation and bottom orientation gates in the same or different levels of the device.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a three-dimensional (3D) integrated circuit (IC) structure, the method comprising:
    forming a first layer of graphene over a substrate;
    forming a first level of one or more active devices using the first layer of graphene;
    forming an insulating layer over the first level of one or more active devices;
    forming a second layer of graphene over the insulating layer; and
    forming a second level of one or more active devices using the second layer of graphene, the second level of one or more active devices electrically interconnected with the first level of one or more active devices;
    wherein the one or more active devices of the first and second levels comprises field effect transistors having a bottom gate orientation relationship with respect to the associated graphene layer, and wherein the bottom gate orientation field effect transistors are formed by:
    forming openings in an associated insulating layer in accordance with a desired gate pattern;
    filling the openings in the associated insulating layer with a gate electrode material and planarizing the gate electrode material to form individual gate electrodes;
    forming a gate dielectric layer over the individual gate electrodes;
    forming the associated graphene layer over the gate dielectric layer;
    patterning the associated graphene layer and gate dielectric layer in accordance with a desired active layout area;
    forming one or more first level conductive pad structures adjacent the first layer of graphene such that a bottom surface of the one or more first level conductive pad structures is substantially co-planar with a bottom surface of the first layer of graphene;
    forming one or more second level conductive pad structures adjacent the second layer of graphene such that a bottom surface of the one or more second level conductive pad structures is substantially co-planar with a bottom surface of the second layer of graphene; and
    forming a plurality of source and drain contacts disposed on the graphene layers, above bottom oriented gate electrodes under the graphene layers.

2. The method of claim 1, wherein forming the first and second graphene layers comprises a dry thermal release tape process.

3. The method of claim 1, wherein the first and second layers of graphene comprise monolayers.

4. The method of claim 1, wherein the one or more field effect transistors of the first level has a different function with respect to the one or more field effect transistors of the second level.

* * * * *